United States Patent
Rouh

(10) Patent No.: US 8,110,501 B2
(45) Date of Patent: Feb. 7, 2012

(54) METHOD OF FABRICATING LANDING PLUG WITH VARIED DOPING CONCENTRATION IN SEMICONDUCTOR DEVICE

(75) Inventor: Kyoung Bong Rouh, Icheon-Si (KR)

(73) Assignee: Hynix Semiconductor Inc., Icheon-si (KR)

(*) Notice: Subject to any disclaimer, the term of this patent is extended or adjusted under 35 U.S.C. 154(b) by 0 days.

(21) Appl. No.: 12/822,461

(22) Filed: Jun. 24, 2010

(65) Prior Publication Data

US 2010/0330801 A1 Dec. 30, 2010

(30) Foreign Application Priority Data

Jun. 26, 2009 (KR) .................. 10-2009-0057629

(51) Int. Cl.
*H01L 21/44* (2006.01)
(52) U.S. Cl. .. 438/667; 438/658; 438/923; 257/E21.166
(58) Field of Classification Search .................. 438/657, 438/658, 923; 257/E21.166
See application file for complete search history.

(56) References Cited

U.S. PATENT DOCUMENTS

| | | | |
|---|---|---|---|
| 5,872,045 A * | 2/1999 | Lou et al. | 438/432 |
| 6,724,085 B2 | 4/2004 | Tomita | |
| 6,869,874 B2 | 3/2005 | Kim et al. | |
| 6,891,244 B2 | 5/2005 | Chen | |
| 2005/0048766 A1* | 3/2005 | Wu et al. | 438/629 |
| 2008/0213983 A1* | 9/2008 | Taguwa | 438/486 |

FOREIGN PATENT DOCUMENTS

| | | |
|---|---|---|
| KR | 10-2002-0053698 | 7/2002 |
| KR | 10-2003-0078562 | 10/2003 |
| KR | 10-2006-0001169 | 1/2006 |

* cited by examiner

*Primary Examiner* — Walter L Lindsay, Jr.
*Assistant Examiner* — Ron Pompey
(74) *Attorney, Agent, or Firm* — Marshall, Gerstein & Borun LLP

(57) ABSTRACT

A method of fabricating a landing plug in a semiconductor memory device, which in one embodiment includes forming a landing plug contact hole on a semiconductor substrate having an impurity region to expose the impurity region; forming a landing plug by filling the landing plug contact hole with a polysilicon layer, wherein the landing plug is divided into a first region, a second region, a third region, and a fourth region from a lower portion of the landing plug, and the first region is doped with a first doping concentration that is relatively lowest, the second region is doped with a second doping concentration that is higher than the first doping concentration, the third region is doped with a third doping concentration that is higher than the second doping concentration and the fourth region is not doped; and annealing the resulting product formed with the landing plug.

6 Claims, 5 Drawing Sheets

METHOD OF FABRICATING LANDING PLUG WITH VARIED DOPING CONCENTRATION IN SEMICONDUCTOR DEVICE

CROSS-REFERENCE TO RELATED APPLICATION

Priority to Korean patent application number 10-2009-0057629 filed Jun. 26, 2009, the entire disclosure of which is incorporated by reference herein, is claimed.

BACKGROUND OF THE INVENTION

The invention relates generally to a semiconductor memory device, and more particularly, to a method of fabricating a landing plug in a semiconductor memory device.

As the degree of integration of semiconductor memory devices has increased, a landing plug is used for electrical connection between an impurity region in a semiconductor substrate and a bit line and a storage node in the case of a Dynamic Random Access Memory (DRAM) device consisting of a transistor and a capacitor. In such a device, a conductive layer is filled in a space adjacent to the impurity region in the semiconductor substrate among spaces between word lines to form a the landing plug and a bit line contact and a storage node contact are formed so as to be connected to the landing plug.

More specifically with reference to FIG. 1, illustrating a DRAM device according to the prior art, a gate stack 120 is disposed on a semiconductor substrate 110 having an impurity region 112, such as a source/drain region. In the gate stack 120 structure, a gate insulation layer 121, a gate conductive layer 122, and a gate capping layer 123 are sequentially stacked. Insulating gate spacer layers 130 are disposed on side walls of the gate stack 120. A landing plug stack hole, by which the impurity region is exposed, is formed in a space between the gate spacer layers 130, and a landing plug 140 can be formed by filling the landing plug contact hole with a polysilicon layer. Such a landing plug 140 is connected to a conductive contact 160 thereabove, which passes through an insulation layer 150. In a DRAM device, this conductive contact 160 is a bit line contact or a storage node contact connected to a capacitor.

The landing plug 140 functions to pass electrical signals between the impurity region 112 therebelow and the conductive contact 160 thereabove. Therefore, to perform such a function, the landing plug 140 is generally formed of a polysilicon layer doped with impurity ions. However, due to a doping concentration of the landing plug 140, a trade-off relationship is established between leakage current properties and resistance properties of the device. Specifically, when the doping concentration of the landing plug 140 is low, resistance inside the landing plug 140 is increased and thus the signal transfer speed between the impurity region 112 and the conductive contact 160 is decreased. When the doping concentration of the landing plug 140 is raised to prevent this phenomenon, the impurity ions inside the landing plug 140 diffuse to the impurity region 112 to increase the intensity of an electric field applied to the impurity region and thus the amount of leakage current in the impurity region 112 increases.

Therefore, to solve these problems, an additional ion implantation process for increasing the doping concentration in only an upper portion of the landing plug 140 has been conventionally performed. According to this procedure, by increasing the doping concentration in the uppermost portion of the landing plug 140 through the additional ion implantation, it is possible to obtain an effect wherein an overall doping concentration of the landing plug 140 is increased while diffusion of the impurity ions into the impurity region 112 is minimized. However, such a method has the disadvantage that the number of process steps is increased and thus fabrication cost is increased, since an ion implantation process is additionally required.

SUMMARY OF THE INVENTION

Embodiments of the invention are directed to a method of fabricating a landing plug in a semiconductor memory device, capable of improving resistance properties with diffusion of impurity ions into an impurity region being restricted without additional ion implantation.

In one embodiment, a method of fabricating a landing plug in a semiconductor memory device includes forming a landing plug contact hole on a semiconductor substrate having an impurity region to expose the impurity region; forming a landing plug by filling the landing plug contact hole with a polysilicon layer, wherein the landing plug is divided into a first region, a second region, a third region, and a fourth region from the lower portion (i.e, the first region is lowermost, the second region is disposed between the first and third regions, and the third regions is disposed between the second and fourth regions, with the fourth region uppermost), and the first region is doped with a first doping concentration that is relatively the lowest, the second region is doped with a second doping concentration that is higher than the first doping concentration, the third region is doped with a third doping concentration that is higher than the second doping concentration and the fourth region is not doped; and annealing the resulting product formed with the landing plug.

Preferably, the landing plug is formed in a polysilicon depositing chamber with supply of a reaction gas for forming the polysilicon layer together with a source gas of impurity ions for doping.

Preferably, the doping into the landing plug is performed using phosphorus (P) as an impurity.

Preferably, the thickness of the first region is 5% to 10% of the total thickness of the landing plug, the thickness of the second region is 75% to 85% of the total thickness of the landing plug, the thickness of the third region is 5% to 10% of the total thickness of the landing plug, and the thickness of the fourth region is 5% or less of the total thickness of the landing plug.

Preferably, the first doping concentration is 5.0E20 atoms/$cm^3$ or less, the second doping concentration is 6.0E20 atoms/$cm^3$ or more and higher than the first doping concentration, and the third doping concentration is 7.0E20 atoms/$cm^3$ or more and higher than the second doping concentration.

Preferably, annealing is performed under a mixed atmosphere of oxygen and nitrogen.

In another embodiment, a method of fabricating a landing plug in a semiconductor memory device, which includes forming a landing plug contact hole on a semiconductor substrate having an impurity region to expose the impurity region; forming a landing plug by filling the landing plug contact hole with a polysilicon layer, wherein the landing plug is divided into a first region, a second region, a third region, and a fourth region from the lower portion (i.e, the first region is lowermost, the second region is disposed between the first and third regions, and the third regions is disposed between the second and fourth regions, with the fourth region uppermost), and the first region is doped with a first doping concentration that is higher than the concentration in the third region, the second region is not doped, the third region is doped with a second doping concentration that is lower than the first doping concentration, and the fourth region is doped with a third doping concentration that is higher than the first doping concentration; and annealing the resulting product formed with the landing plug.

Preferably, forming of the landing plug is performed in a polysilicon depositing chamber with supply of a reaction gas for forming the polysilicon layer together with a source gas of impurity ions for doping.

Preferably, doping into the landing plug is performed using phosphorus (P) as an impurity.

Preferably, the thickness of the first region is 5% to 10% of the total thickness of the landing plug, the thickness of the second region is 5% or less of the total thickness of the landing plug, the thickness of the third region is 75% to 85% of the total thickness of the landing plug, and the thickness of the fourth region is 5% to 10% of the total thickness of the landing plug.

Preferably, the first doping concentration 7.0E20 atoms/$cm^3$ or more and higher than the second doping concentration, the second doping concentration is 5.0E20 atoms/$cm^3$ or more and lower than the first doping concentration, and the third doping concentration is 5.0E20 atoms/$cm^3$ or more and higher than the first doping concentration.

Preferably, the annealing is performed under a mixed atmosphere of oxygen and nitrogen.

In accordance with the invention, by dividing various regions inside a landing plug in a vertical direction upon formation of the landing plug and setting doping concentrations in the respective regions to be different from one another, resistance properties can be improved with diffusion of impurity ions into an impurity region being restricted without additional ion implantation.

DESCRIPTION OF SPECIFIC EMBODIMENTS

Hereinafter, a method for fabricating a fine pattern in accordance with the invention is described in detail with reference to the accompanying drawings.

FIGS. 2 through 7 illustrate a method of fabricating a landing plug in a semiconductor memory device in accordance with one embodiment of the invention.

Figure 1:
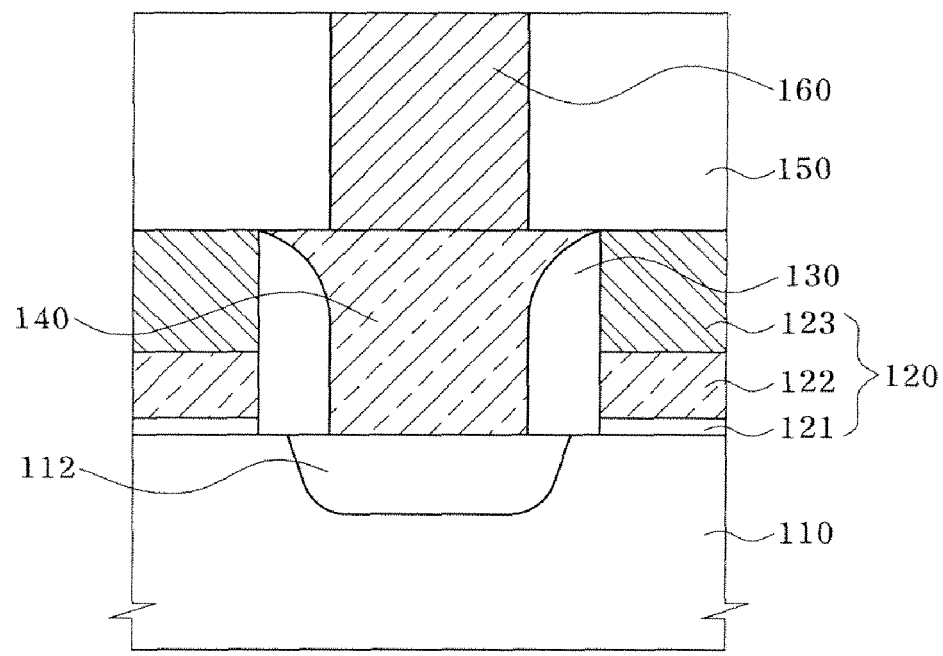
FIG. 1 is a sectional view illustrating an example of a semiconductor memory device having a landing plug.
Figure 2:
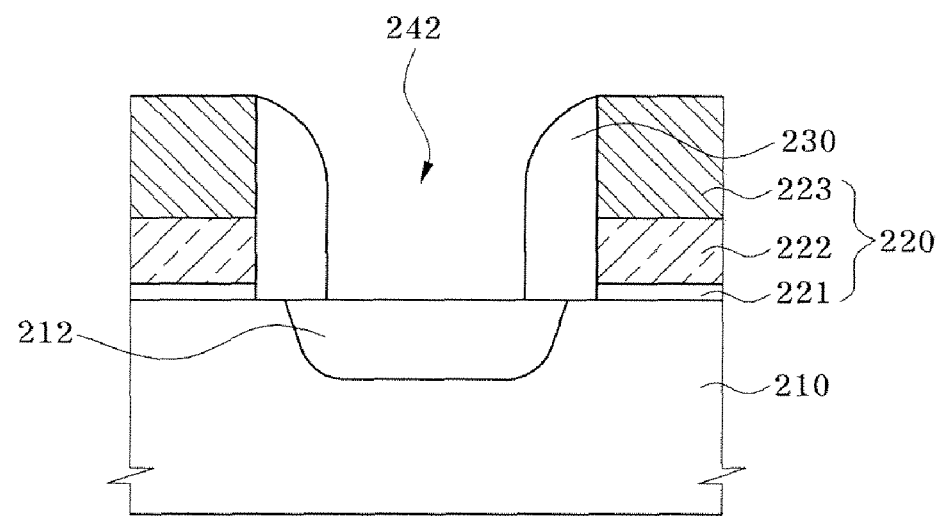
FIGS. 2 through 7 illustrate a method of fabricating a landing plug in a semiconductor memory device in accordance with an embodiment of the invention.

Referring first to FIG. 2, a gate stack 220 and an insulating gate spacer layer 230 are formed on a semiconductor substrate 210 having an impurity region 212. The impurity region 212 is a source/drain region and is doped with n-type impurity ions or p-type impurity ions. The gate stack structure includes a sequential stack of a gate insulation layer 221, a gate conductive layer 222, and a gate capping layer 223. As such, the gate stack 220 and gate spacer layer 230 are formed, and a landing plug contact hole 242 exposing a surface of the impurity region 212 is formed between adjacent gate spacer layers 230. Though not shown, an insulation layer such as an oxide layer can be used to define the landing plug contact hole 242.

Figure 3:
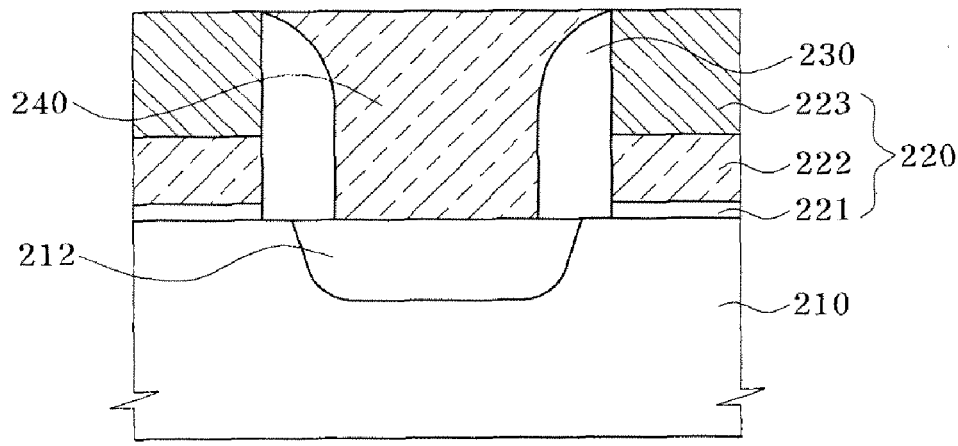

Referring next to FIG. 3, the landing plug contact hole (the hole 242 of FIG. 2) is filled with a polysilicon layer to form a landing plug 240. At this time, the landing plug 240 is divided into a first region, a second region, a third region, and a fourth region from a portion adjacent to the impurity region 212 along a vertical direction. Also, the first region, the second region, and the third region are doped with impurity ions at different concentrations to have a concentration gradient and the fourth region is not doped with the impurity ions.

Figure 4:
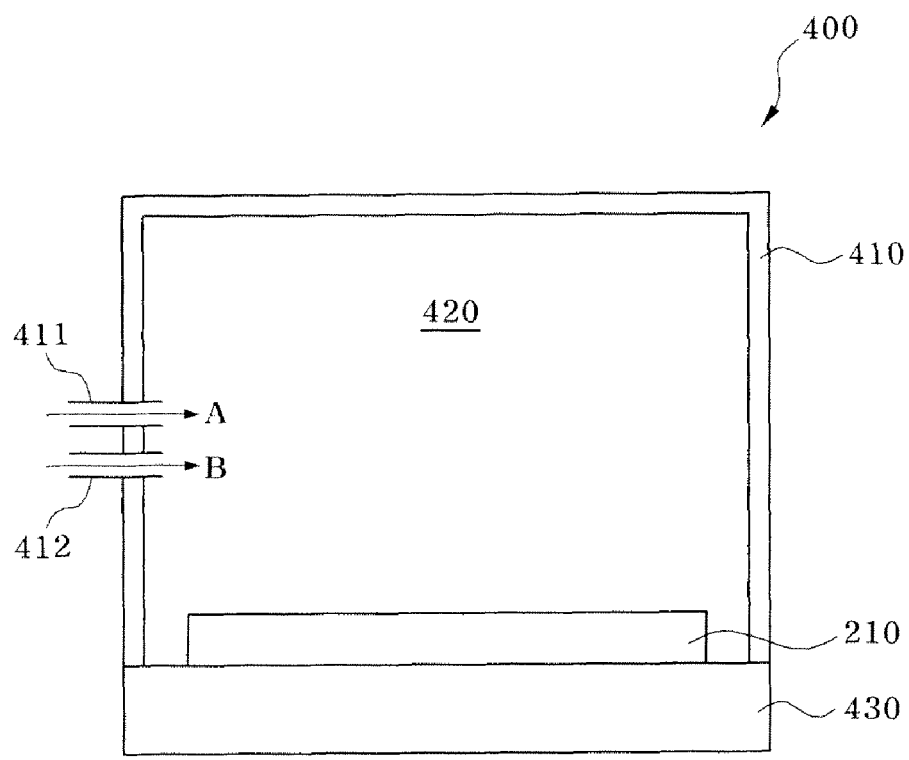

Describing an example of a method of forming the landing plug 240 with reference to FIG. 4, a semiconductor substrate 210 formed with the landing plug contact hole (hole 242 of FIG. 2) is loaded in a polysilicon layer depositing chamber, generally designated 400, e.g. a chemical vapor deposition (CVD) chamber, having an outer wall 410 that defines an inside reaction space 420, and a wafer support 430. Thereafter, a temperature and a pressure inside the polysilicon layer depositing chamber 400 are suitably set and a reaction gas A for forming the polysilicon layer is then supplied into the reaction space 420 through a first reaction gas injection port 411. Simultaneously, a source gas B of impurity ions is supplied through a second reaction gas injection port 412. When the impurity ions are n-type impurity ions, i.e. n-channel type, phosphorus (P) ions with good diffusion ability are used as the impurity ions. As the reaction gas A for forming the polysilicon layer and the source gas B of impurity ions are injected into the inside of the reaction space 420, a polysilicon layer doped with the impurity ions is deposited on the surface of the impurity region 212 of the semiconductor substrate 210. During this process, the amount of supplied source gas B is controlled to be different depending on a deposited thickness of the polysilicon layer in order to make the doping concentration in the respective regions of the landing plug 240.

Figure 5:
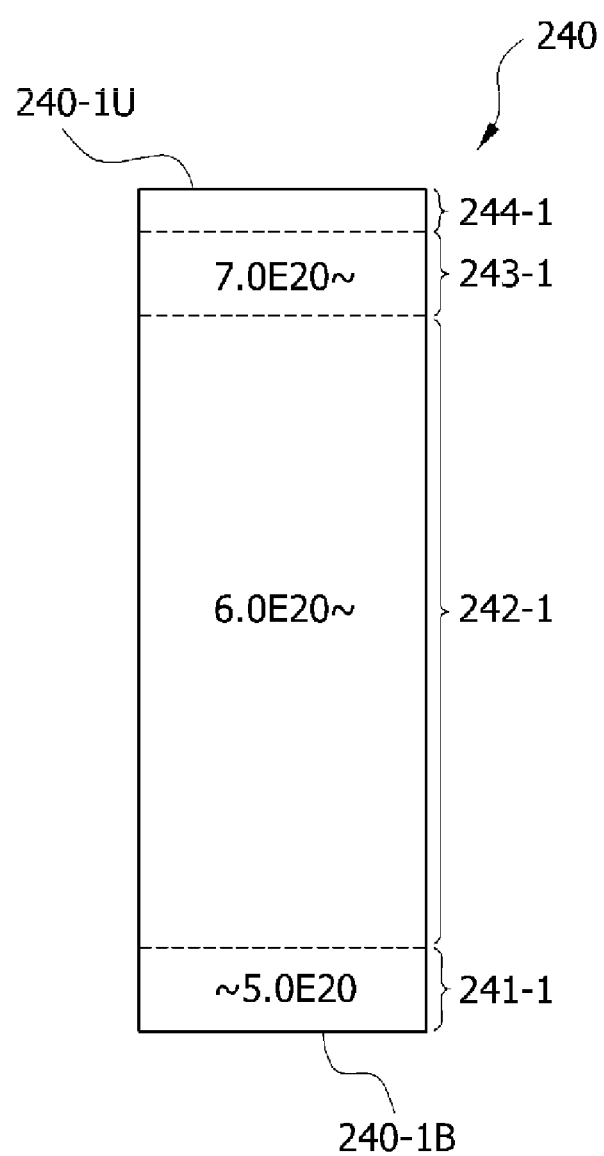

FIG. 5 illustrates an example of divided regions of the landing plug 240 formed as described above and the doping concentrations in the respective regions. As illustrated in FIG. 5, the landing plug 240 is divided into a first region 241-1, a second region 242-1, a third region 243-1, and a fourth region 244-1 from a lower face 240-1B adjacent to the impurity region 212 to an upper face 240-1U. The first region 241-1 preferably has a thickness of 5% to 10% of the total thickness of the landing plug 240. The second region 242-1 preferably has a thickness of 75% to 85% of the total thickness of the landing plug 240. The third region 243-1 preferably has a thickness of 5% to 10% of the total thickness of the landing plug 240. And, the fourth region 244-1 preferably has a thickness of 5% or less of the total thickness of the landing plug 240. For example, in a case that the total thickness of the landing plug 240 is 2000 Å, the first region 241-1 preferably has a thickness of 100 Å to 200 Å, the second region 242-1 preferably has a thickness of 1500 Å to 1700 Å, the third region 243-1 preferably has a thickness of 100 Å to 200 Å, and the fourth region 244-1 preferably has a thickness of 100 Å or less.

The doping concentrations in the regions divided as such are different from one another. Specifically, the first region 241-1 is doped with a first doping concentration that is relatively lowest, the second region 242-1 is doped with a second doping concentration that is higher than the first doping concentration, the third region 243-1 is doped with a third doping concentration that is higher than the second doping concentration, and the fourth region is a passivation region that is not doped. In an example, the first doping concentration in the first region 241-1 illustratively is 5.0E20 atoms/$cm^3$ or less and lower than the second doping concentration. The second doping concentration in the second region 242-1 preferably is 6.0E20 atoms/cm$^3$ or more and higher than the first doping concentration. The third doping concentration in the third region 243-1 preferably is 7.0E20 atoms/cm$^3$ or more and higher than the second doping concentration. As such, by setting the impurity concentration in the first region 241-1 of the landing plug 240 adjoining to the impurity region 212 to the first doping concentration which is the lowest and establishing a concentration gradient in which the impurity concentration is increases as is far from the impurity region 212, it is possible to minimize the diffusion of the impurities into the impurity region 212 with total doping concentration in the landing plug 240 being increased although a subsequent annealing is performed.

Figure 6:
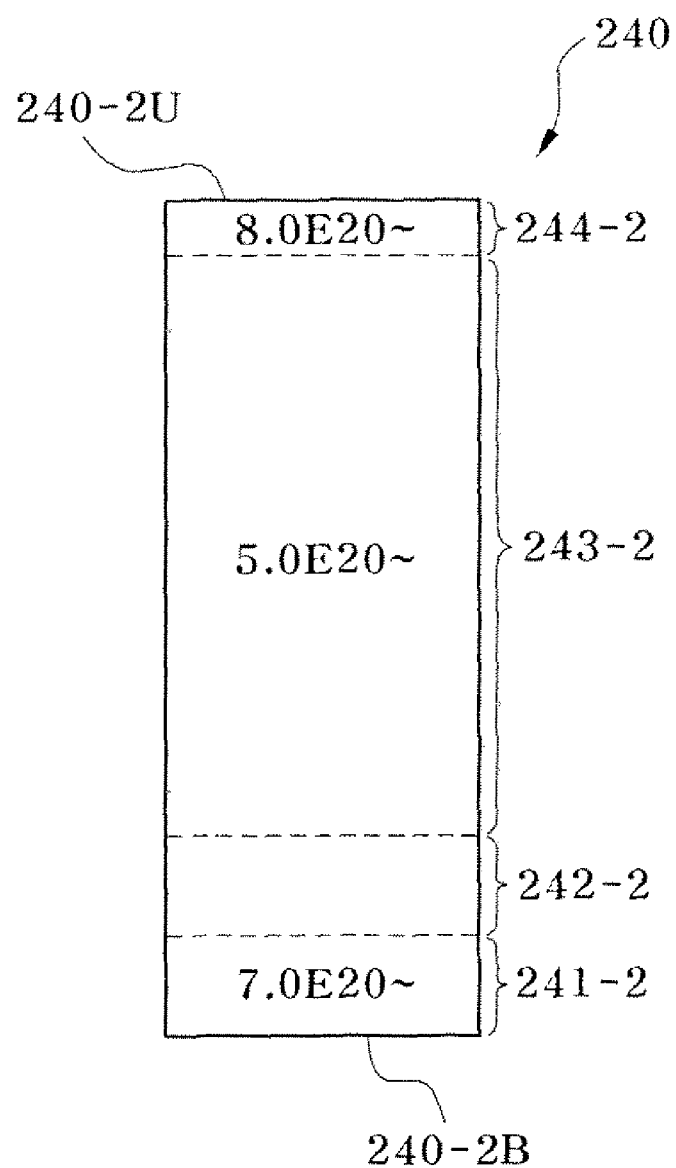

FIG. 6 illustrates another example of divided regions of the landing plug 240 formed as described above and doping concentrations in the respective regions. As illustrated in FIG. 6, the landing plug 240 is divided into a first region 241-2, a second region 242-2, a third region 243-2, and a fourth region 244-2 from a lower face 240-2B adjacent to the impurity region 212 to an upper face 240-1U. The first region 241-2 preferably has a thickness of 5% to 10% of the total thickness of the landing plug 240. The second region 242-2 preferably has a thickness of 5% or less of the total thickness of the landing plug 240. The third region 243-2 preferably has a thickness of 75% to 85% of the total thickness of the landing plug 240. And, the fourth region 244-2 preferably has a thickness of 5% to 10% of the total thickness of the landing plug 240. For example, in a case that the total thickness of the landing plug 240 is 2000 Å, the first region 241-2 illustratively has a thickness of 100 Å to 200 Å, the second region 242-2 illustratively has a thickness of 100 Å or less, the third region 243-2 illustratively has a thickness of 1500 Å to 1700 Å and the fourth region 244-2 illustratively has a thickness of 100 Å to 200 Å.

The doping concentrations in the regions divided as such are different from one another. Specifically, the first region 241-2 is doped with a first doping concentration that is higher than the concentration in the third region 243-2. The second region functions as a buffer layer and to this end is not doped with the impurity ions. The third region 243-3 is doped with a second doping concentration that is lower than the first doping concentration. And, the fourth region 244-3 is doped with a third doping concentration that is higher than the first doping concentration. In an example, the first doping concentration in the first region 241-2 preferably is 7.0E20 atoms/cm$^3$ or more and higher than the second doping concentration. The second doping concentration in the third region 243-2 preferably is 5.0E20 atoms/cm$^3$ or more and lower than the first doping concentration. The third doping concentration in the fourth region 244-2 preferably is 5.0E20 atoms/cm$^3$ or more, highly preferably 8.0E20 atoms/cm$^3$, and higher than the first doping concentration. In this example, as compared to that described with reference to FIG. 5, the impurity concentration in the first region 241-2 of the landing plug 240 adjacent to the impurity region 212 is set to relatively high but the second region 242-2 as a buffer region not doped with the impurity ions is disposed on the first region 241-2, and therefore it is possible to restrict more the diffusion of the impurity ions into the impurity region 212 as impurity ions inside the first region 241-2 are diffused to the second region 242-2 or the buffer region even after the subsequent annealing is performed.

Figure 7:
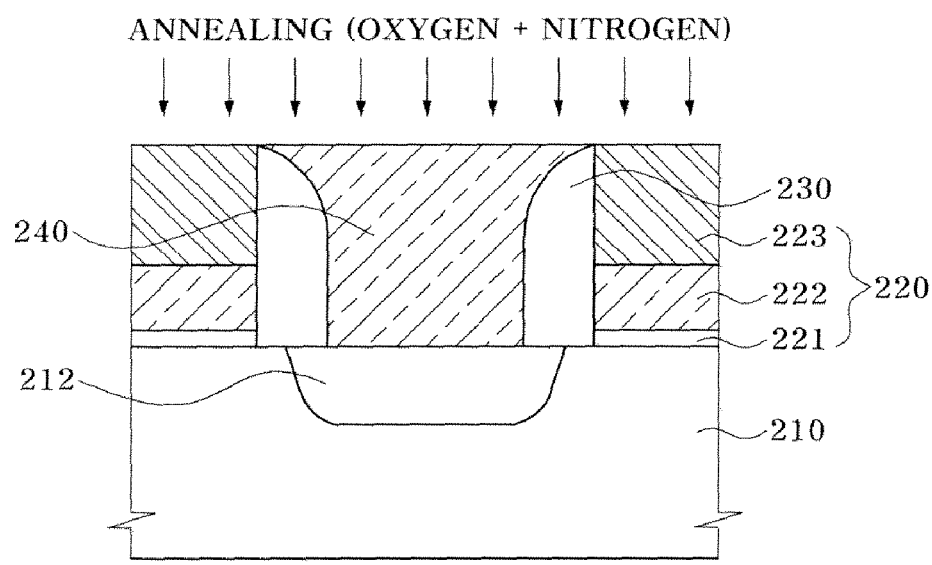

Referring to FIG. 7, after the landing plug 240 is formed, annealing for activation of the impurity ions doped into the landing plug 240 is performed. This annealing preferably is performed in a rapid thermal process (RTP) under a mixed atmosphere of oxygen and nitrogen, highly preferably with supply of oxygen at a flow rate of 1000 ppm and nitrogen at a flow rate of 1000 ppm. The oxygen and nitrogen supplied ensures that the impurity ions doped into the upper portion of the landing plug 240 with a high concentration are maintained unchanged in the upper portion of the landing plug 240. The annealing preferably is performed in the same chamber as the chamber used upon the formation of the landing plug 240. By such annealing, the impurity ions doped into the landing plug 240 are activated.

Figure 8:
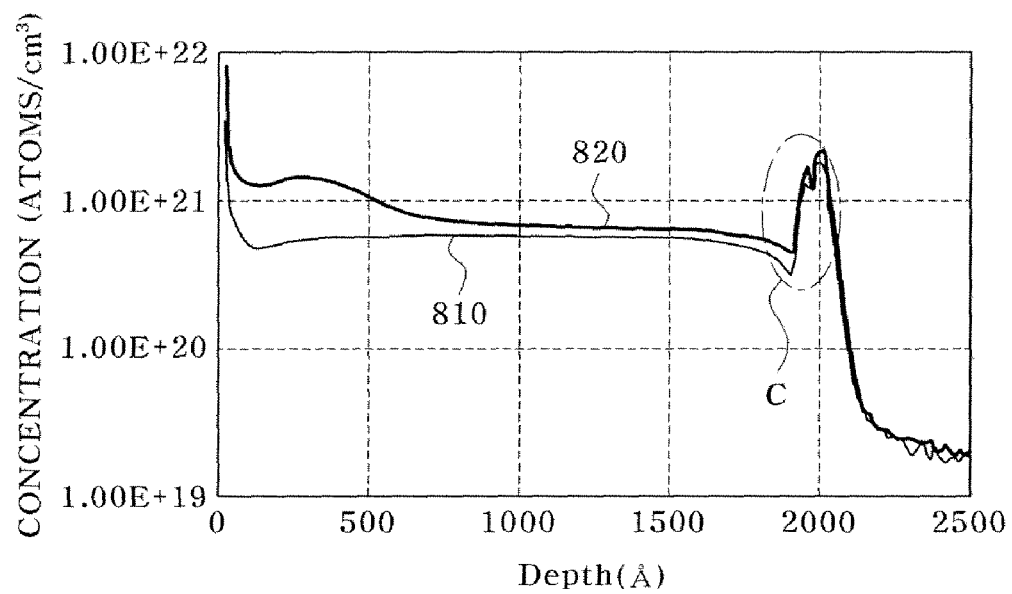
FIG. 8 is a graph comparing a profile of the impurity concentration in the landing plug of a semiconductor memory device formed in accordance with an embodiment of the invention with that of a conventional structure.

FIG. 8 is a graph comparing a profile of the impurity concentration in the landing plug of a semiconductor memory device formed in accordance with an embodiment of the invention with that of a conventional structure. In FIG. 8, the reference symbol 810 indicates an impurity concentration profile in the landing plug when an additional ion implantation process is performed, and the reference symbol 820 indicates an impurity concentration profile in the landing plug when a concentration gradient is established upon the formation of the landing plug as in the invention. As shown by 'C', the impurity concentrations in the region adjacent to the impurity region are similar and, particularly in the surface portion, the concentration in the invention is somewhat higher. Therefore, in accordance with the invention, without an additional ion implantation process, the total concentration in the landing plug is increased with diffusion of impurity ions into an impurity region being restricted and thus both leakage current properties and resistance properties can be improved.

While the invention has been described with respect to the specific embodiments, various changes and modifications may be made without departing from the spirit and scope of the invention as defined in the following claims.

What is claimed is:

1. A method of fabricating a landing plug in a semiconductor memory device, comprising:
   forming a landing plug contact hole on a semiconductor substrate having an impurity region to expose the impurity region;
   forming a landing plug by filling the landing plug contact hole with a polysilicon layer, wherein the landing plug comprises a first region, a second region, a third region, and a fourth region, with the first region being disposed between the substrate and the second region and having a first doping concentration, the second region being disposed over the first region and under the third region and having a second doping concentration that is higher than the first doping concentration, the third region being disposed over the second region and under the fourth region and having a third doping concentration that is higher than the second doping concentration, and the fourth region being disposed over the third region and not being doped; and
   annealing the resulting product formed with the landing plug.

2. The method of claim 1, comprising forming the landing plug in a polysilicon depositing chamber with supply of a reaction gas for forming the polysilicon layer together with a source gas of impurity ions for doping the landing plug.

3. The method of claim 1, comprising doping the landing plug using phosphorus (P) as an impurity.

4. The method of claim 1, wherein the thickness of the first region comprises 5% to 10% of the total thickness of the landing plug, the thickness of the second region comprises 75% to 85% of the total thickness of the landing plug, the thickness of the third region comprises 5% to 10% of the total thickness of the landing plug, and the thickness of the fourth region comprises 5% or less of the total thickness of the landing plug.

5. The method of claim 1, wherein the first doping concentration is 5.0E20 atoms/cm3 or less, the second doping concentration is 6.0E20 atoms/cm3 or more and is higher than the first doping concentration, and the third doping concentration is 7.0E20 atoms/cm3 or more and is higher than the second doping concentration.

6. The method of claim 1, comprising annealing under a mixed atmosphere of oxygen and nitrogen.

* * * * *